United States Patent
Henryk

(10) Patent No.: US 9,608,565 B2
(45) Date of Patent: Mar. 28, 2017

(54) ELECTRIC CIRCUIT OF A GENERATOR OF OSCILLATIONS

(71) Applicant: AIUT Sp.z o.o., Gliwice (PL)

(72) Inventor: Zajdel Jozef Henryk, Katowice (PL)

(73) Assignee: AIUT SP. Z O. O., Gliwice (PL)

(*) Notice: Subject to any disclaimer, the term of this patent is extended or adjusted under 35 U.S.C. 154(b) by 0 days.

(21) Appl. No.: 14/820,515

(22) Filed: Aug. 6, 2015

(65) Prior Publication Data

US 2016/0344341 A1    Nov. 24, 2016

(30) Foreign Application Priority Data

May 20, 2015 (EP) .................................. 15461535

(51) Int. Cl.
*H03B 5/12* (2006.01)
*H03B 5/24* (2006.01)

(52) U.S. Cl.
CPC .......... *H03B 5/1203* (2013.01); *H03B 5/1228* (2013.01); *H03B 5/24* (2013.01); *H03B 2200/0008* (2013.01)

(58) Field of Classification Search
CPC ... H03B 1/04; H03B 5/00; H03B 5/08; H03B 5/12; H03B 5/1203; H03B 5/1228; H03B 5/1231; H03B 5/1296; H03B 5/20; H03B 5/24; H03B 2200/0008; H03B 2200/001
USPC ............ 331/108 B, 117 FE, 117 R, 135, 167
See application file for complete search history.

(56) References Cited

U.S. PATENT DOCUMENTS

| | | | | | |
|---|---|---|---|---|---|
| 3,363,197 | A | * | 1/1968 | Melhus | G04C 3/108 331/116 M |
| 3,621,471 | A | * | 11/1971 | Dick | H03C 3/24 327/432 |
| 4,287,489 | A | * | 9/1981 | Pinkham | H03B 5/1243 331/117 R |
| 5,959,504 | A | * | 9/1999 | Wang | H03K 3/354 331/115 |
| 8,044,733 | B1 | * | 10/2011 | Arora | H03B 5/1243 331/117 FE |
| 2005/0212611 | A1 | * | 9/2005 | Muthali | H03B 5/04 331/117 R |
| 2005/0264371 | A1 | * | 12/2005 | Lee | H03B 5/1243 331/177 V |
| 2008/0111644 | A1 | * | 5/2008 | Jang | H03B 5/1228 331/167 |
| 2011/0032044 | A1 | * | 2/2011 | Lee | H03B 5/1228 331/117 FE |
| 2012/0075028 | A1 | * | 3/2012 | Sornin | H03B 5/1203 331/1 R |

* cited by examiner

*Primary Examiner* — Levi Gannon
(74) *Attorney, Agent, or Firm* — Masuvalley & Partners

(57) ABSTRACT

The invention relates to an electric circuit of a generator of oscillations, comprising an enhancement-mode field transistor T1, inductance L1 and resistance R1 connected to the source or the drain of the transistor T1, characterized in that the inductance L1 is connected directly between the gate and the drain of the transistor T1 or to an electric circuit of a generator of oscillations, comprising an depletion-mode field transistor T1, inductance L1 and resistance R1 connected with its one end to the source of the transistor T1, characterized in that the inductance L1 is connected directly between the gate of the transistor T1 and the other end of the resistance R1.

12 Claims, 4 Drawing Sheets

ELECTRIC CIRCUIT OF A GENERATOR OF OSCILLATIONS

RELATED APPLICATIONS

This application claims priority to European Patent Application No. 15461535, filed May 20, 2015, entitled Electric Circuit Of A Generator Of Oscillations, which is hereby incorporated herein by reference in its entirety.

TECHNICAL FIELD

The invention relates to an electric circuit of a generator of oscillations, comprising a field transistor, an inductance and a resistance.

BACKGROUND

The basic generator schemes have been known for every long time. The oldest ones are described e.g. on the web page http://km5z.us/files/RCA%20Home%20Study/Theory%20Lesson%2030%20Oscillators.pdf. Over the time these schemes differed only by using parts produced in new technology, but realized similar functions. The realization of such circuit in a currently available technology and other new solutions is well described in the book by Andrei Grebennikov—*RF and Microwave Transistor Oscillator Design*, John Wiley & Sons, 2007 (ISBN 978-0-470-02535-2).

Practical implementation of the circuits described in the Grebennikov's book needs many parts (elements) and often requires selection of operating point for these elements.

The present invention discloses the simplest, not described earlier, electrical circuit able to generate oscillations.

SUMMARY

The purpose of the invention is to provide a oscillations generator, which ensures stability of the operating point, does not require special selection or adjustment of the operating point and at the same time it would comprise the minimal number of elements.

The simplest and best stabilized operating point conditions are well known from handbooks and utilize a self tuning reference voltage (marked RefV) circuits, which use the Gate Threshold Voltage of a FET transistor. FIGS. 1-3 (prior art) show examples of such circuits with n-channel MOSFET transistors. For p-channel MOSFET transistors the scheme is the same, but polarity of supply (VCC) is negative. Positive polarity of supply for n-channel transistor is noted by a "+" sign before VCC. FIGS. 1 and 2 are for transistors where the Gate Threshold Voltage has the same polarity as the work polarity of the drain. Such transistors are called enhancement-mode transistors. FIG. 3 illustrates a circuit with a transistors, whose Gate Threshold Voltage has the opposite polarity to the work polarity of the drain. Such transistors are called depletion-mode transistors.

In circuits of FIGS. 1 and 2, the gate of the transistor is connected with the drain, which causes a strong negative feedback, assuring good operating point but at the same time being a potential source of instabilities if a delay exists between the drain and the gate. Similarly, in FIG. 3 there is a strong negative feedback and instability can occur if a delay exist between the pole of supply and the gate.

The potential instability emerging in the aforementioned circuits of FIGS. 1-3 is used in the present invention to obtain oscillations by purposefully introducing a delay by properly adding an inductance.

According to the invention, an electric circuit of a generator of oscillations, comprising an enhancement-mode field transistor T1, inductance L1 and resistance R1 connected to the source or the drain of the transistor T1, is characterized in that the inductance L1 is connected directly between the gate and the drain of the transistor T1.

Alternatively, according to the invention, an electric circuit of a generator of oscillations, comprising an depletion-mode field transistor T1, inductance L1 and resistance R1 connected with its one end to the source of the transistor T1, is characterized in that the inductance L1 is connected directly between the gate of the transistor T1 and the other end of the resistance R1.

The aforementioned alternatives are in fact, from the point of view of a skilled person, i.e. an electronic engineer, two alternative embodiments of the same inventive idea, involving same or corresponding technical features for providing the same technical effect—which is spontaneous generation of oscillations in an electric circuit. In the most general aspect of the present invention, the inductance L1 is connected directly between the gate of the field transistor T1 and a point P of the inventive generator's circuit, wherein the point P is selected such that after the gate of the transistor is connected with the point P and connecting the transistor to the power supply, the Gate Treshold Voltage of the transistor T1 occurs in the point P. The transistor T1 may be an n-channel enhanced mode filed transistor, a p-channel enhanced mode filed transistor, an n-channel depletion mode filed transistor or a p-channel depletion mode filed transistor, while the construction details of the invention circuit depend on the type of the transistor T1 used.

Preferably, the circuit additionally comprises a first capacity C1 connected in parallel to the resistance R1.

Preferably, the circuit additionally comprises a second capacity C2 connected in parallel to the inductance L1.

Preferably, the circuit comprises exactly one transistor T1 and/or exactly one inductance L1 and/or exactly one resistance R1 and/or exactly one first capacity C1 and/or exactly one second capacity C2.

BRIEF DESCRIPTION OF DRAWINGS

Preferred embodiments of the present invention are presented in a more detailed way with reference to the attached drawings, in which.

DETAILED DESCRIPTION AND EMBODIMENTS

Figure 1:
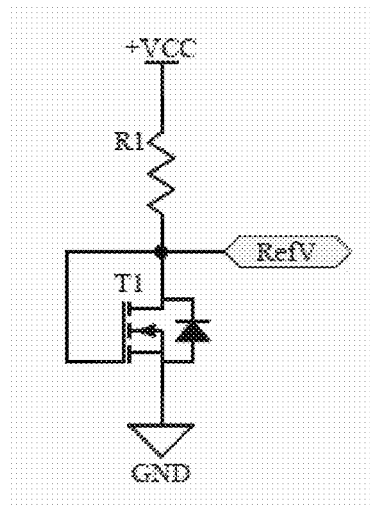
FIGS. 1, 2 and 3 (prior art)—show known realizations of stabilized operating point circuits, on the basis of which the present invention has been made by adding an inductance.
Figure 2:
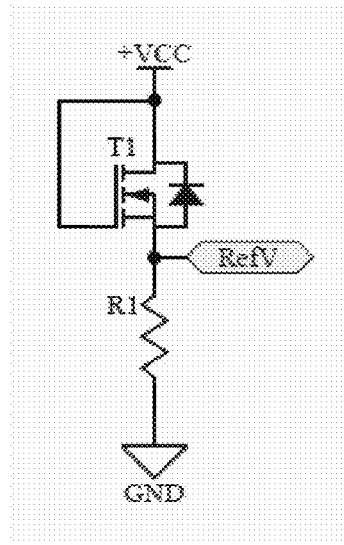
Figure 3:
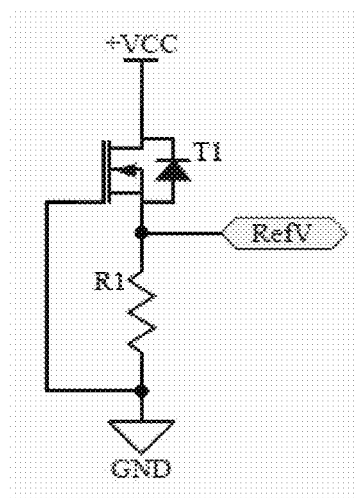

As mentioned above, the potential instability emerging in the circuits of FIGS. 1-3 is used in the present invention to obtain oscillations by purposefully introducing a delay by properly adding an inductance.

Figure 4:
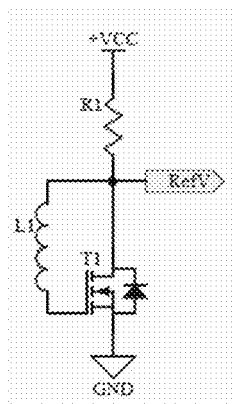
FIGS. 4, 5 and 6—illustrate the essence of the present invention, i.e. circuits of FIG. 1-3 with an inductance added.
Figure 5:
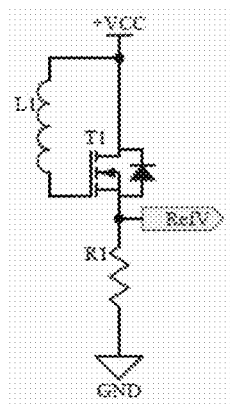
Figure 6:
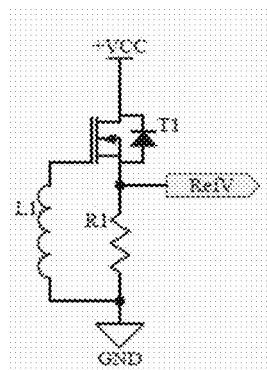

The inductance is connected either between the gate and the drain as show in FIG. 4 and FIG. 5 for an enhancement-mode transistor or between the gate and the pole of a supply for a depletion-mode transistor, as show in FIG. 6.

Figure 7:
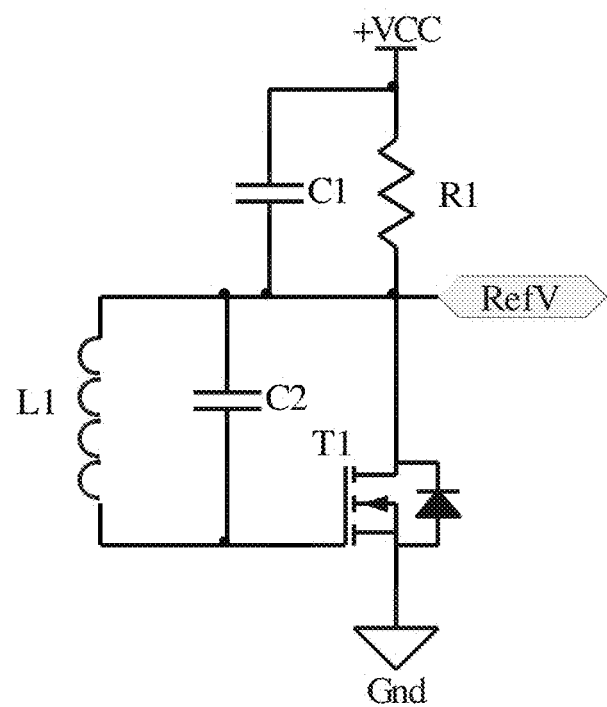
FIG. 7—shows the scheme of FIG. 4 with a first and second capacities added; in a similar manner a first and/or second capacity may be added to circuits shown in FIGS. 5-6.

It is possible to add an additional parallel first capacity C1 to the resistance R1 and/or an additional parallel second capacity C2 to the inductance L1, as shown by way of example in FIG. 7, but they are not necessary for generating oscillations. The second capacity C2 makes oscillations more sinusoidal but also makes oscillations more difficult to evoke—because when the second capacity C2 is present—starting of oscillation takes more time. Therefore the basic structures of the inventive circuit are those in FIGS. 4, 5 and 6.

Figure 8:
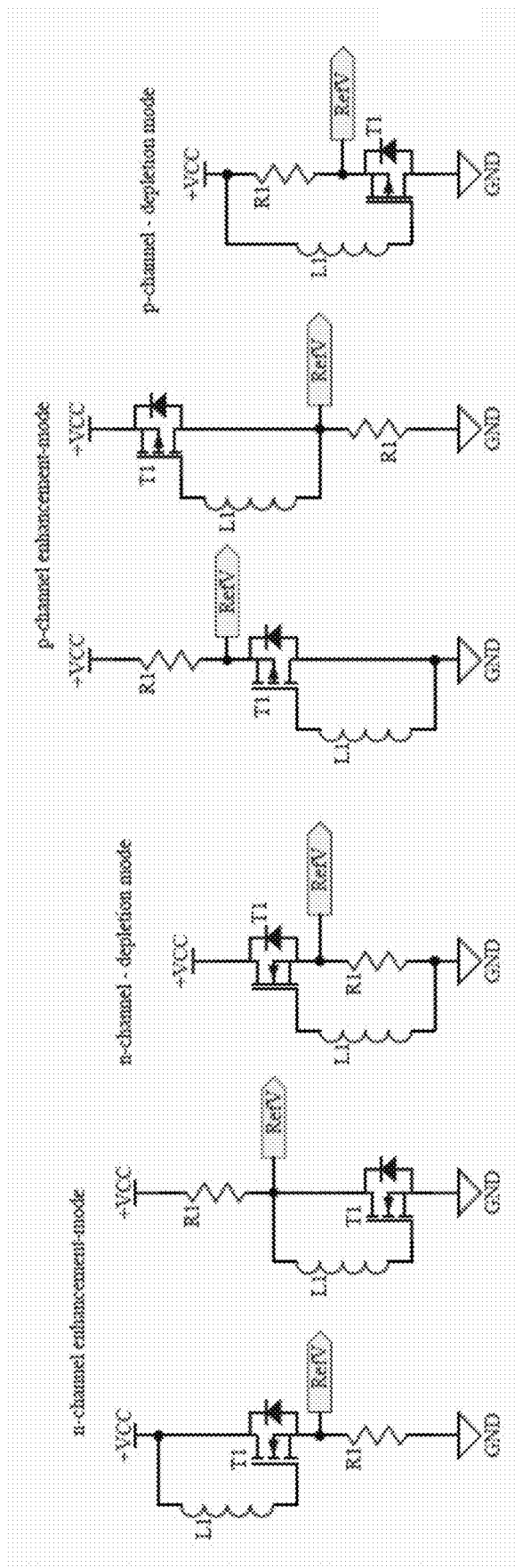
FIG. 8—shows the final possible schemes of the inventive circuits depending on the type of the transistor T1 used.

Depending on the type of the transistor used, the final possible schemes of inventive circuits are shown in FIG. 8.

For generation of oscillations a circuit comprising exactly one transistor T1, exactly one inductance L1 and exactly one resistance R1 is sufficient.

Figure 9:
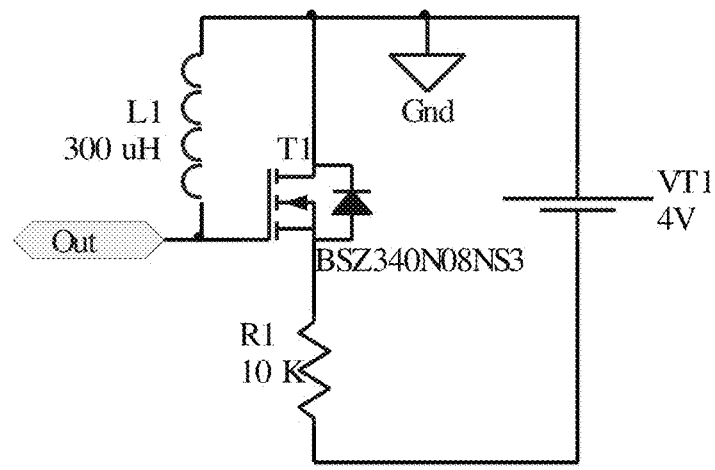
FIG. 9—shows an example inventive circuit used for simulations made in the LTSPICE software.
Figure 10:
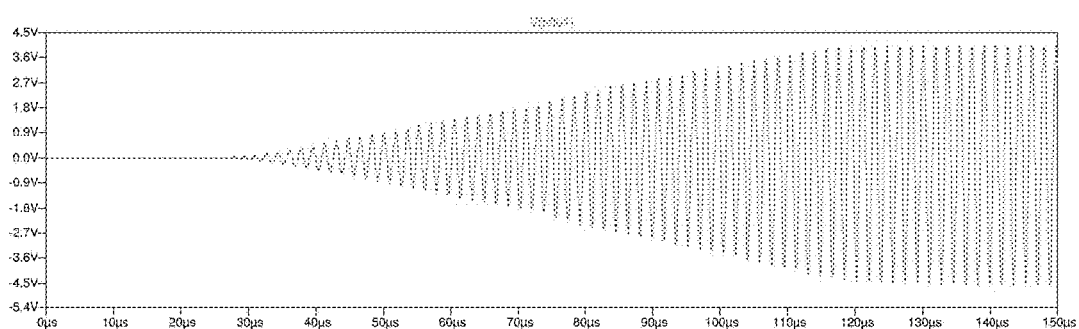
FIG. 10—shows the results of the LTSPICE software simulation (voltage as a function of time) made for the circuit shown in FIG. 8, wherein in the vertical axis there is the value of the Out signal in volts and on the horizontal axis there is the time in microseconds.

The generated signal can be fed/taken from the point marked as RefV in the figures or from the gate of the transistor T1. FIG. 9 shows an example inventive circuit used for simulations made in the LTSPICE software. The result of the simulation (voltage as a function of time) is shown in FIG. 10, in which in the vertical axis there is the value of the Out signal in volts and on the horizontal axis there is the time in microseconds.

The invention claimed is:

1. An electric circuit of a generator of oscillations comprising:
    a single n-channel enhancement-mode field transistor (T1);
    exactly one inductance (L1), which is connected directly between a gate of the transistor (T1) and a drain of the transistor (T1);
    a resistance (R1) connected directly between a source of the transistor (T1) and a ground or connected directly between a supply voltage and the drain of the transistor (T1).

2. The circuit according to claim 1, characterized in that it additionally comprises a first capacity (C1) connected in parallel to the resistance (R1).

3. The circuit according to claim 2, characterized in that it comprises exactly one first capacity (C1).

4. The circuit according to claim 1 characterized in that it additionally comprises a second capacity (C2) connected in parallel to the inductance (L1).

5. The circuit according to claim 4, characterized in that it comprises exactly one second capacity (C2).

6. The circuit according to claim 1, characterized in that it comprises exactly one resistance (R1).

7. An electric circuit of a generator of oscillations comprising:
    a single p-channel enhancement-mode field transistor (T1);
    exactly one inductance (L1), which is connected directly between a gate of the transistor (T1) and a drain of the transistor (T1);
    a resistance (R1) connected directly between the source of the transistor (T1) and a supply voltage or connected between the drain of the transistor (T1) and a ground.

8. The circuit according to claim 7 further comprising a first capacity (C1) connected in parallel to the resistance (R1).

9. The circuit according to claim 8 wherein the circuit comprises exactly one first capacity (C1).

10. The circuit according to claim 7 further comprising a second capacity (C2) connected in parallel to the inductance (L1).

11. The circuit according to claim 10 wherein the circuit comprises exactly one second capacity (C2).

12. The circuit according to claim 7 wherein the circuit comprises exactly one resistance (R1).

* * * * *